United States Patent [19]
Besson

[11] 4,317,059
[45] Feb. 23, 1982

[54] ACCELERATION AND TEMPERATURE COMPENSATED PIEZOELECTRIC BI-RESONATOR

[75] Inventor: Raymond Besson, Besançon, France
[73] Assignee: Etat Francais, Paris, France
[21] Appl. No.: 79,239
[22] Filed: Sep. 26, 1979
[30] Foreign Application Priority Data
  Oct. 9, 1978 [FR] France .............................. 78 28728
[51] Int. Cl.³ ............................................. H01L 41/08
[52] U.S. Cl. .................................... 310/361; 310/350; 310/342; 310/363; 310/366; 310/369; 310/346
[58] Field of Search ............... 310/315, 349, 341–344, 310/346, 347, 361, 367, 369, 350, 363–365; 331/116 R, 158, 162

[56] References Cited
U.S. PATENT DOCUMENTS

| | | | |
|---|---|---|---|
| 2,210,045 | 8/1940 | Schneider | 310/350 |
| 2,232,277 | 2/1941 | Schneider | 310/350 |
| 2,293,485 | 8/1942 | Baldwin | 310/342 X |
| 2,321,358 | 6/1943 | Bokovoy | 310/342 X |
| 3,431,392 | 3/1969 | Garland | 310/343 |
| 4,135,108 | 1/1979 | Besson | 310/361 |
| 4,219,754 | 8/1980 | Hoshi et al. | 310/342 X |

FOREIGN PATENT DOCUMENTS 2338607 8/1977 France .
2353997 12/1977 France .

*Primary Examiner*—Mark O. Budd
*Attorney, Agent, or Firm*—James E. Nilles

[57] ABSTRACT

A piezoelectric bi-resonator with electrodes not adhering to the crystal, comprising at least first and second plates in dielectric material on which plates are deposited respectively first and second electrodes, a third plate in dielectric material having faces opposed to the first and second plates respectively, on which faces are respectively deposited third and fourth electrodes, connected together, and a piezoelectric body constituted by two piezoelectric chips made of quartz, independent and similar, one of which is interposed between the said first and third electrodes, without contact therewith, and the other is interposed between the second and fourth electrodes without contact therewith, the said piezoelectric quartz chips being arranged so that their axes Y' are opposite.

2 Claims, 3 Drawing Figures

ACCELERATION AND TEMPERATURE COMPENSATED PIEZOELECTRIC BI-RESONATOR

The present invention relates to a piezoelectric bi-resonator with electrodes not adhering to the crystal, of the type comprising at least first and second plates made of a dielectric material and mounted in a sealed enclosure, on which plates are deposited respectively first and second electrodes, and a piezoelectric body interposed between the said first and second electrodes, without contact therewith.

The piezoelectric resonators with electrodes not adhering to the crystal are currently proving to be very advantageous due in particular to the possibility of producing this type of resonators with excellent qualities as far as the electrical and mechanical characteristics are concerned. Examples of piezoelectric resonators performing with electrodes not adhering to the crystal are described in particular in French Pat. No. 2 338 607.

When constructing piezoelectric resonators that are called upon to be used for example in the field of aeronautics, the constant aim is to allow the best possible unsensitivity of the devices towards accelerations and variations of temperature.

It is precisely the object of the present invention to produce a resonator whose stabilities over long periods are improved, and whose sensitivity to accelerations or variations of temperature is reduced.

These objects are achieved with a resonator of the type mentioned hereinabove which, according to the invention, further comprises a third plate in dielectric material, provided with faces that are opposed to the first and second plates respectively, and on which are respectively deposited third and fourth interconnected electrodes and such that the piezoelectric body is constituted by two piezoelectric quartz chips independent and similar, one of which is interposed between the said first and third electrodes, with no contact therewith, and the other is interposed between the second and fourth electrodes, with no contact therewith, the said piezoelectric quartz chips being arranged in such a way that their axes y' are opposite.

Preferably, the quartz chips are also arranged so that their axes Z are opposite.

Moreover, according to an interesting embodiment the piezoelectric quartz chips are flat convex and their convexity is directed towards their axis y'.

Advisably, the quartz chips used should be as similar as possible, that-is-to-say made of one and the same material, and obtained by the same cutting technique. Performances are improved if for example two quartz chips come from the same basic crystal and from adjacent areas of the said basic crystal.

The combination of two similar quartz chips inside a resonator, and their disposition with opposed axes y' has led to the production of a bi-resonator whose sensitivity to accelerations for example is reduced by a factor of between 10 and 20. Furthermore, the device remains very compact since only one additional dielectric plate is necessary to support the two electrodes interposed between the two quartz chips.

The structure of the above-defined bi-resonator may be used in various advantageous ways.

For example, according to a first application, the first resonator part constituted by the first piezoelectric chip and the first and third electrodes has a resonance frequency substantially equal to the resonance frequency of the second resonator part constituted by the second piezoelectric chip and the second and fourth electrodes.

In such a case, the first and second resonator parts may be connected either in series or in parallel.

According to another application, the first resonator part constituted by the first piezoelectric chip and the first and third electrodes has a resonance frequency which is clearly different from the resonance frequency of the second resonator part constituted by a second piezoelectric chip and the second and fourth electrodes, the first and second resonator portions being electrically connected in parallel.

The first and second resonator parts can then show resonance frequencies which differ by about 5% at least.

The use of a bi-resonator composed of two resonator parts of different frequencies is especially interesting to allow a virtually total release from the effect of the temperature.

In general, it is advantageous for a piezoelectric resonator to operate at the temperature of inversion of the piezoelectric crystal. Therefore it is advisable to heat the resonator to bring it to a temperature around the temperature of inversion of the crystal. If this heating is done externally, it is all the more difficult when the bulk of the resonator to be heated is great, and when the atmosphere inside which the crystal is placed is inert.

According to a special characteristic of the present invention, the quartz chips can be brought very easily to a desired temperature, and the presence of dielectric plates, far from creating an obstacle to the heating of the crystal, is on the contrary an easy means of heating the resonator.

This is possible due to the fact that the first, second and third plates are coated, at least on their faces directed towards the piezoelectric chips, with an extra heating layer of a material of given resistivity, the said extra layer being connected to a source of electric power, electrically insulated from the energizing electrodes deposited on the plates by an insulating layer.

As a variant, to either replace or complement the heating method previously described, and insofar as the bi-resonator comprises peripheral rings surrounding respectively the active portions of the piezoelectric chips in position between two electrodes, and constituting a spacer between two plates carrying the said electrodes, it is possible to coat the said rings with heating layers of a material of given resistivity and to connect said heating layers to a source of electrical power so as to obtain a radial heating of the quartz chips.

The invention is described in greater details hereinafter with reference to non-limitative embodiments and to the accompanying drawings, in which:

FIG. 1 illustrates an example of a piezoelectric resonator according to the invention, but does not show either the sealed outer enclosure, or the means for securing the operational unit on the inside of the enclosure.

Figure 1:
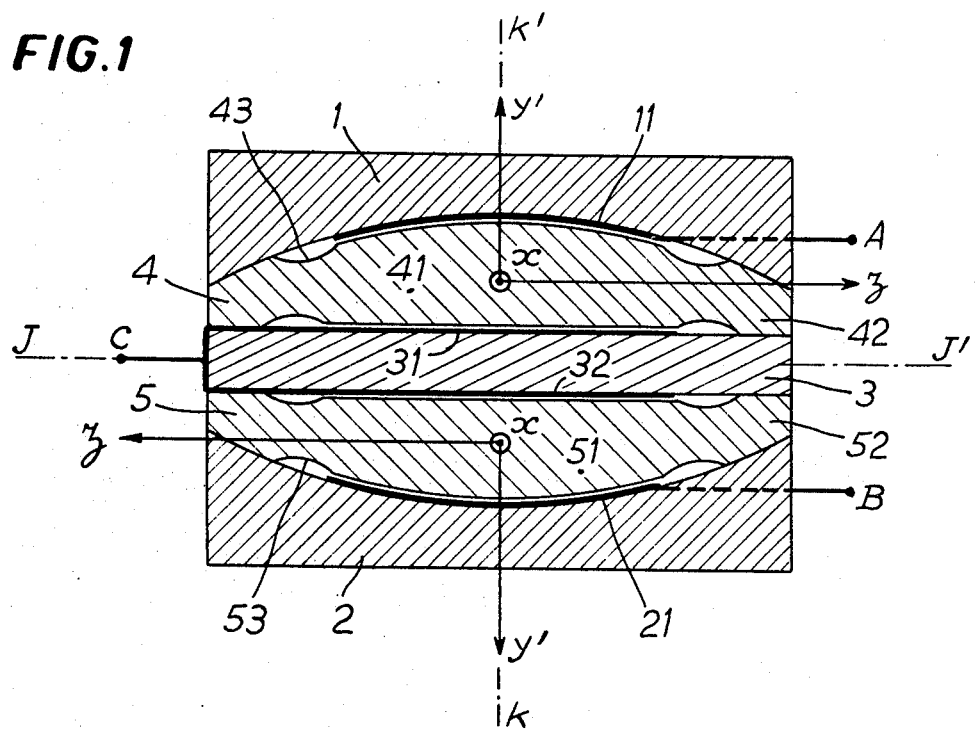
FIG. 1 is an axial cross-sectional view of a piezoelectric bi-resonator according to the invention.

Two outside plates 1 and 2 made of a dielectric material are provided, on their inside faces, with electrodes 11 and 21, respectively, deposited by metallization and respectively connected to connecting terminals A and B. A piezoelectric body in two parts 4,5 is interposed between the plates 1 and 2. The piezoelectric chips 4,5 are separated from each other by an additional dielectric plate 3, carrying electrodes 31, 32 on its faces turned towards the chips 4 and 5 respectively. The electrodes 31 and 32 are themselves connected to a joint terminal C.

The quartz chip 4 comprises a vibrating active portion 41 interposed between the electrodes 11 and 31 and situated at a very short distance from the latter but without any contact therewith. In the same way, the quartz chip 5 is provided with a vibrating active portion 51 interposed between the electrodes 21 and 32 and situated at a very short distance therefrom, but without any contact therewith.

In general, the apparent structure of a bi-resonator according to the invention may be entirely symmetrical with respect to the median plane J—J' of the central plate 3 and even in some cases have a rotational symmetry about the axis K—K'. However, the relative position of the two quartz chips 4,5 with respect to their crystallographic axes is not unimportant. Thus, the quartz chips 4,5 should be mounted so that the axes Y' of the two chips are opposite (FIG. 1). Whenever the chips 4,5 are flat-convex, it is then advantageous to produce the convexity on the side of the positive axis Y' of each chip, although this condition is not absolutely necessary.

Furthermore, the quartz chips 4,5 are preferably positioned between the plates 1, 2 and 3 so that the axes Z of the two quartz chips 4,5 are opposite. If the chips 4,5 both correspond either to righthand crystals or to lefthand crystals, the axes x of the chips 4,5 are then in the same direction (FIG. 1).

There are different ways to hold the active portion 41, 51 of the chips 4,5 in position between the electrodes 11,31 and 21,32. According to one advantageous embodiment shown in FIG. 1, a chip 4,5 comprises a ring-shaped portion 42,52 which serves as a spacer between the plates 1 and 3, and 2 and 3 respectively. The distance between the different plates is thus accurately determined, and the active portion 41,51 of the chips 4,5 which is slightly set back with respect to the peripheral support portion 42,52 may be situated at a very short distance from the electrodes 11,31 or 21,32.

A thinner intermediate portion 43,53 which may be cut into a part of the periphery of the active portion 41,51 ensures respectively a mechanical connection and a vibratory isolation between the vibrating active portion 41,51 and the stationary supporting portion 42,52. Such a suspension method has already been described in French Pat. No. 2,338,607.

However, the invention is not limited to such a suspension method. For example, the portions 42,52 may be constituted by independent rings, whilst the active portions 41,51 are held in position with respect to the plates 1, 2 and 3 by thermocompression means for example.

Several modi operandi of the bi-resonator according to the invention are possible. For example, the resonator parts constituted by the electrodes 11, 31 and the crystal 41 on the one hand, and by electrodes 21, 32 and crystal 51 on the other, can show frequencies that are substantially equal or clearly different.

Whenever the two resonator parts 11,31,41 and 21,32,51 have equal or substantially equal resonance frequencies, it is possible to provide a series connection, namely with the application of an alternating voltage between terminals A and B, the terminal C being disconnected, or a parallel connection, namely with the application of an alternating voltage between terminal C and terminals A and B, which are then connected together. In either case, a single resonator or bi-resonator is obtained whose sensitivity to accelerations is clearly reduced compared with a resonator in which only one quartz chip is used. The resulting bi-resonator also shows very improved short-term and long-term stabilities.

Figure 2:
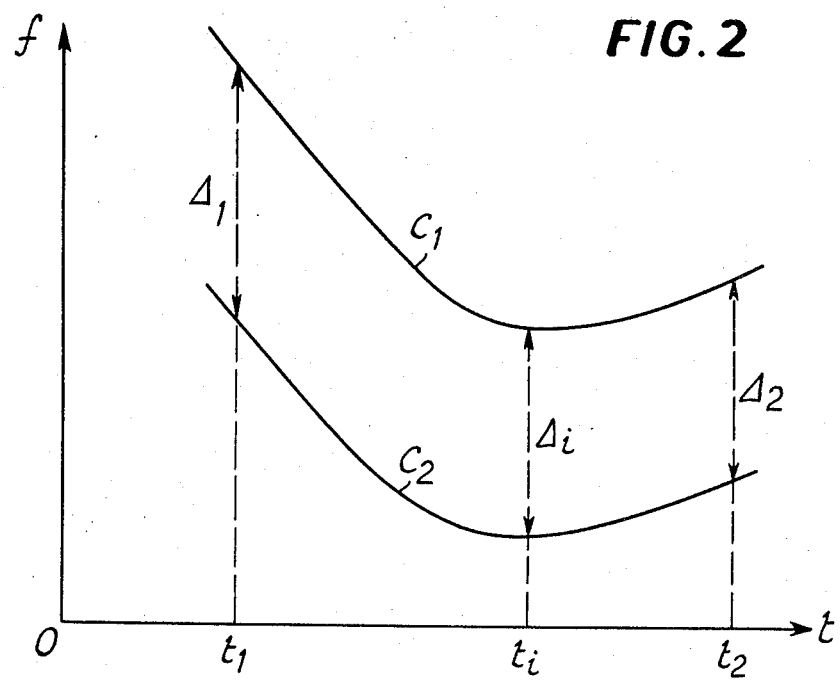
FIG. 2 is a graph showing the variations of the resonance frequency as a function of the temperature.

According to another possibility of connection, the resonator parts 11,31,41 and 21,32,51 have very different resonance frequencies, for example with a difference of 1 MHz, said parts are connected in parallel. Inasmuch as the quartz chips 4 and 5 are as similar together as possible (same starting material and cut out in the same way from the basic crystal) the evolution of the resonance frequency of the resonator parts 11,31,41 and 21,32,51 is identical. FIG. 2 shows the evolution of the frequency of the chip 41 (curve $C_1$) as a function of the temperature, and the evolution of the frequency of the chip 51 (curve $C_2$) also as a function of the temperature. The two curves are virtually parallel and as a result, the frequency difference $\Delta_1, \Delta_2$ which is obtained at different temperatures $t_1$, $t_2$ when the resonator parts 11,31,41 and 21,32,51 are connected in parallel, is virtually independent of the temperature and remains extremely close to the limit value $\Delta i$ obtained for the temperature ti of the reversal points of the chips 41, 51. The system thus obtained is a so-called immediate-heating system, that-is-to-say operational even before the temperature of invention is reached.

As with the previously described utilization methods the sensitivity to accelerations is also greatly reduced.

Figure 3:
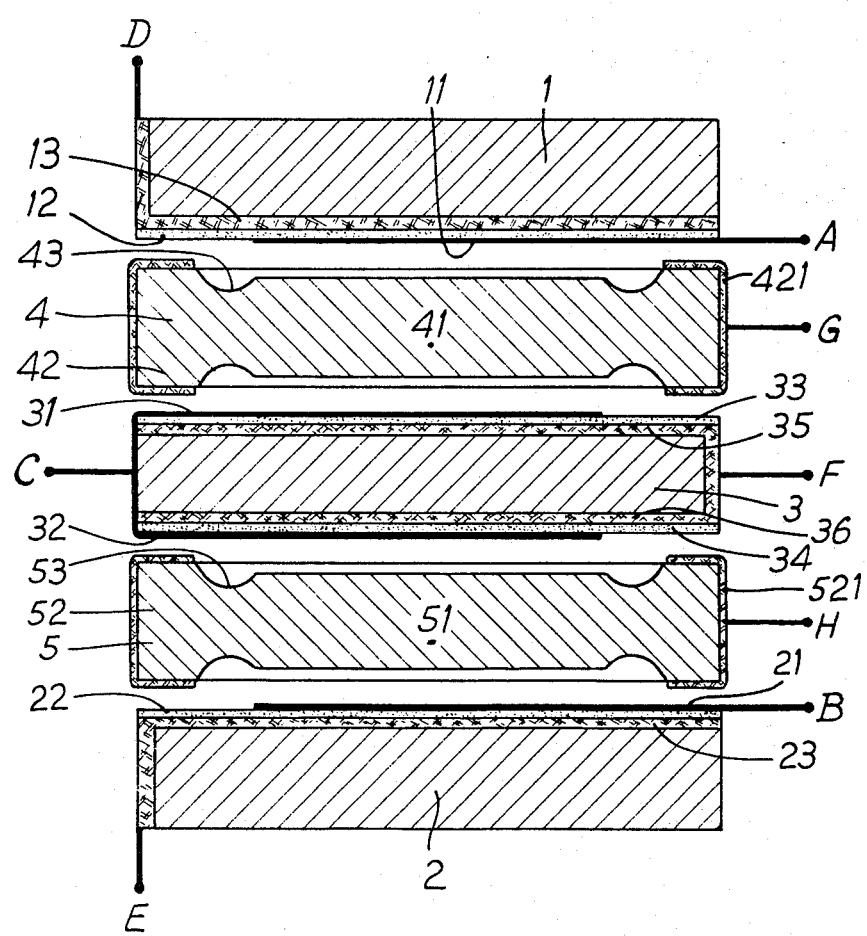
FIG. 3 is an exploded view, in axial cross-section, of a special embodiment of bi-resonator according to the invention.

FIG. 3 shows an exploded cross-sectional view of a special embodiment of bi-resonator wherein the temperature of inversion ti of the quartz chips 4,5 can be obtained very easily and quickly, regardless of the bulk of the dielectric material that needs to be brought to a predetermined temperature. The bi-resonator in FIG. 3 is indeed fitted with heating means inside the sealed enclosure, notshown, containing the quartz chips 4,5 and the plates 1,2,3 carrying the electrodes.

According to the embodiment shown in FIG. 3, layers of a material with a given resistivity are deposited on the non-vibrating portions of the bi-resonator, and in particular on the electrode-supporting plates, in the immediate vicinity of the active portions 41,51 of the quartz chips 4,5. Thus, resistive layers 13,23 are deposited on the dielectric plates 1,2 respectively, whilst resistive layers 35,36 are deposited on the plate 3. Each resistive layer 13,23,35,36 may be deposited directly on the corresponding dielectric plate and then covered with a thin layer of insulating material 12,22,33,34, such as SiO for example, on which an electrode 11,21,31 or 32 may then be deposited. According to another possible embodiment, the electrodes 11,21,31 and 32 are first deposited by metallization on the corresponding plates 1,2 and 3, and then thin insulating layers 12,22,33,34 are superposed on the electrodes and covered by the heat-conducting layers 13,23,35,36.

The resistive layers 13,23,35 and 36 are connected to terminals D,E,F respectively, which allow the passage of an electric current in the said resistive layers in order to ensure a heating by Joule effect, in the immediate vicinity of the active portions 41,51 of the quartz chips 4,5. It will be noted that the presence of the resistive heating layers, relatively thick with respect especially to the electrodes, does not affect the coefficient of quality of the resonator, since the said layers are deposited on non-vibrating portions.

According to another characteristic, resistive heating layers 421,521 are deposited on parts 42,52 respectively of the chips 4,5 forming spacer rings for holding the plates 1,2 and 3 in position. Resistive heating layers 421,521 are connected to current sources via the terminals G,H respectively and allow a radial heating of the active portions 41,51 of the quartz chips 4,5. The layers 421,521 likewise do not affect the coefficient of quality of the bi-resonator since they are deposited on immobilized parts. It is possible of course to use the layers 421,521 separately or in combination with the layers 13,23,35,36 deposited on the plates 1,2,3. It is understood that the resistive layers 421,521 may be deposited on the peripheral portions 42,52 connected to the portions 41,51 as well as on peripheral portions constituted by independent rings.

The various embodiments described hereinabove are given by way of information only. It would also be possible to subdivide each quartz chip 4,5 into two more independent chips, separated by an additional dielectric plate carrying electrodes, so as to improve, by a suitable connection of the different electrodes, certain performances of the resonators, without substantially increasing the volume of the device. Indeed, the addition in the same box, of an extra quartz chip only involves the simultaneous addition of an extra plate carrying electrodes.

What is claimed is:

1. A piezoelectric bi-resonator having a piezoelectric body comprising two independent and similar piezoelectric crystal chips and having electrodes that do not adhere to the chips, said bi-resonator being characterized by:
   a. a plate of dielectric material having opposite faces, each having a coating that provides one of a pair of electrodes, the electrodes of said pair being electrically connected with one another;
   b. a pair of members of dielectric material, each having a face on which there is a coating that provides a further electrode, said members being respectively disposed at opposite sides of said plate and each having its further electrode in opposing spaced relationship to one of said pair of electrodes;
   c. said crystal chips being at opposite sides of said plate, each being interposed between one of said pair of electrodes and one of said further electrodes and having an active portion which is spaced from both of the electrodes between which the chip is interposed;
   d. said crystal chips being in positions and orientations such that their Y' axes are opposite;
   e. means defining peripheral rings surrounding and connected with the active portions of said crystal chips and cooperating with said plate and said members to maintain the spacings between said active portions and said electrodes and to maintain the chips in said positions and orientations, and
   f. each of said faces having thereon a layer of electrical resistance material that heats upon passage of a current therethrough, insulated from the electrode on the same face by a layer of insulating material.

2. The bi-resonator of claim 1 wherein each of said rings comprises an annular coating of electrical resistance material surrounding the periphery of a chip and overlying marginal portions of each face thereof, through which a current can be passed for heating of the chip.

* * * * *